(12) United States Patent
Pellon et al.

(10) Patent No.: US 7,400,481 B2
(45) Date of Patent: *Jul. 15, 2008

(54) LOW COST ARC FAULT DETECTION TECHNIQUE

(75) Inventors: Christian V. Pellon, Norton, MA (US); Christopher A. Nicolls, Cumberland, RI (US); Michael T. Parker, Camarillo, CA (US)

(73) Assignee: Sensata Technologies, Inc., Attleboro, MA (US)

( * ) Notice: Subject to any disclaimer, the term of this patent is extended or adjusted under 35 U.S.C. 154(b) by 169 days.

This patent is subject to a terminal disclaimer.

(21) Appl. No.: 11/320,865

(22) Filed: Dec. 29, 2005

(65) Prior Publication Data

US 2007/0153436 A1 Jul. 5, 2007

(51) Int. Cl.
*H02H 3/08* (2006.01)
*H02H 9/02* (2006.01)
*H02H 3/00* (2006.01)
*H02H 7/00* (2006.01)
*H02H 9/08* (2006.01)

(52) U.S. Cl. .......................... 361/93.1; 361/7; 361/78; 361/79; 361/44; 361/45; 361/47

(58) Field of Classification Search ................. None
See application file for complete search history.

(56) References Cited

U.S. PATENT DOCUMENTS

| | | |
|---|---|---|
| 6,504,692 B1 | 1/2003 | Macbeth et al. |
| 6,987,389 B1 * | 1/2006 | Macbeth et al. ............. 324/536 |
| 7,227,729 B2 * | 6/2007 | Parker et al. ................... 361/42 |
| 2004/0042137 A1 | 3/2004 | Wong et al. |
| 2004/0066593 A1 | 4/2004 | Kolker et al. |
| 2007/0058304 A1 | 3/2007 | Parker et al. |

OTHER PUBLICATIONS

U.S. Appl. No. 11/225,585, filed Sep. 13, 2005 entitled Arc Fault Detection Technique.

* cited by examiner

*Primary Examiner*—Stephen W Jackson
*Assistant Examiner*—Dharti H Patel
(74) *Attorney, Agent, or Firm*—Russell E. Baumann

(57) ABSTRACT

Low cost apparatus and methods of detecting arc faults for better discriminating electrical events. The arc fault detection apparatus includes a current sensor, a di/dt input sense circuit, a dv/dt input sense circuit, and a processing unit. The current sensor monitors a power line current, and provides high frequency components of the power line current to the di/dt input sense circuit. The dv/dt input sense circuit monitors a power line voltage. The di/dt and dv/dt input sense circuits generate signals carrying information relating to changes in the power line current and the power line voltage, respectively. The processing unit analyzes these changes in the power line current and the power line voltage to discriminate detected electrical arcing events from nuisance loads with increased accuracy.

24 Claims, 9 Drawing Sheets

LOW COST ARC FAULT DETECTION TECHNIQUE

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present invention relates generally to apparatus and methods for detecting arc faults, and more specifically to low cost arc fault detection apparatus and methods.

U.S. patent application Ser. No. 11/225,585 filed Sep. 13, 2005 entitled ARC FAULT DETECTION TECHNIQUE and assigned to the same assignee of the present invention (the '585 application) discloses an arc fault detection apparatus that has a reduced susceptibility to nuisance tripping. As disclosed in the '585 application, the arc fault detection apparatus comprises an analog front end including a current sensor, an input sense circuit, and an arcing sense circuit; a power supply; a tripping (firing) circuit; a processing unit; and, an electromechanical interface. The current sensor monitors an AC power line current input, and provides high frequency components of the AC current to the input sense circuit. Next, the input sense circuit filters and rectifies the AC signal at its input, and provides the rectified signal to the arcing sense circuit. The arcing sense circuit then provides a voltage level accumulated over a predetermined sampling period, and one or more digital signals indicative of possible electrical arcing events (i.e., di/dt events) occurring during the sampling period, to the processing unit. Next, the processing unit measures the voltage level, stores information relating to the measured voltages and the digital signals provided thereto, and processes the stored information using one or more algorithms to determine whether the signals resulted from an arc fault or a nuisance load. In the event the signals resulted from an arc fault, the processing unit activates the firing circuit to trip the electromechanical interface, thereby interrupting a power output to the load.

Although the arc fault detection apparatus disclosed in the '585 application can be successfully employed to detect and distinguish between electrical arcing and nuisance loads under a broad range of operating conditions, there is an increasing need for arc fault detection devices suitable for use in low cost applications. For example, such low cost arc fault detection devices might be employed in conjunction with cord sets for lamps or any other suitable household or industrial appliances. As described above, conventional arc fault detection apparatus typically include an analog front end configured to sense a differential input current (di/dt). However, such an analog front end is typically implemented using numerous discrete electrical and electronic components, which can significantly increase the total number of device components, the total cost of the components, and the cost of manufacturing the arc fault detection device. The increased number of discrete components included in the conventional arc fault detection apparatus can also lead to a reduction in the overall reliability of the device.

It would therefore be desirable to have low cost apparatus and methods of detecting arc faults. Such arc fault detection apparatus would include a reduced number of discrete electrical and electronic components. It would also be desirable to have low cost arc fault detection apparatus and methods that can better discriminate electrical arc faults from nuisance loads.

BRIEF SUMMARY OF THE INVENTION

In accordance with the present invention, low cost apparatus and methods of detecting arc faults are provided for better discriminating electrical arc faults from nuisance loads. The presently disclosed arc fault detection apparatus has a lower cost because it includes a front end that can be implemented using a reduced number of discrete electrical and electronic components. In addition, the disclosed arc fault detection apparatus can better discriminate electrical arc faults from nuisance loads because, in response to the detection of a possible electrical arcing condition, it analyzes not only changes in the power line current (di/dt), but also changes in the power line voltage (dv/dt). It is noted that some electrical arcing events are characterized by high dv/dt conditions that can occur simultaneously with frequent levels of high di/dt. By analyzing changes in both the power line current (di/dt) and the power line voltage (dv/dt), the arc fault detection apparatus can discriminate such electrical events with increased accuracy.

In one embodiment, the low cost arc fault detection apparatus comprises a front end including a current sensor and a di/dt input sense circuit, and a processing unit. The current sensor includes a transformer, which monitors an AC power line current input and magnetically couples the high frequency components of the AC current from its primary coil to its secondary coil. The di/dt input sense circuit includes a rectifier circuit, which receives the high frequency AC current components from the current sensor, performs full wave or half wave rectification of the AC signal, and provides the rectified signal (the "di/dt signal") to a first analog input of the processing unit for subsequent analysis. The low cost arc fault detection apparatus further comprises a dv/dt input sense circuit including a charging capacitor and a current limiting resistor, which are employed to derive a signal carrying information relating to changes in the power line voltage (the "dv/dt signal"). In this embodiment, the dv/dt signal is derived from the full wave rectified power line voltage. The dv/dt input sense circuit provides the dv/dt signal to a second analog input of the processing unit.

During a specified measurement period, the processing unit polls the voltage states of the di/dt and dv/dt signals provided by the di/dt and dv/dt input sense circuits, respectively, and generates a plurality of data streams from the information obtained therefrom. In the presently disclosed embodiment, the specified measurement period is equal to slightly less than one half of a cycle of the AC power mains. Next, the processing unit generates three data streams, specifically, a first data stream including information relating to the number of times the di/dt signal level exceeded a first specified voltage threshold, a second data stream including information relating to the number of times the dv/dt signal level exceeded a second specified voltage threshold, and a third data stream including information relating to the length of time the di/dt signal level exceeded the first specified threshold, during the specified measurement period. For example, the processing unit can generate the first and second data streams by counting the number of state transitions occurring at the first and second analog inputs, respectively. Further, the processing unit can generate the third data stream by accumulating the length of time that the di/dt signal remains in a particular state at the first analog input. After the measurement period expires, the processing unit stores the information relating to the first, second, and third data streams in memory.

Next, the processing unit analyzes the information included in the first, second, and third data streams generated during the most recent measurement period, and optionally analyzes the information included in data streams generated during one or more previous measurement periods. In the presently disclosed embodiment, the processing unit analyzes the first data stream(s) by determining the number of times the di/dt signal level exceeded the first specified threshold during the respective measurement periods. Specifically, the processing unit maintains a first running count of the number of times the di/dt signal level exceeded the first threshold during one or more successive measurement periods. In the event the first running count exceeds a first predetermined value, thereby indicating an electrical arcing condition, the processing unit activates a firing circuit to trip an electromechanical interface for interrupting a power output to a load. Similarly, the processing unit analyzes the second data stream(s) by determining the number of times the dv/dt signal level exceeded the second specified threshold during the respective measurement periods. Specifically, the processing unit maintains a second running count of the number of times the dv/dt signal level exceeded the second threshold during one or more successive measurement periods. In the event the second running count exceeds a second predetermined value, thereby indicating a possible electrical arcing condition, the processing unit adds a specified quantity to the first running count, thereby increasing the speed and likelihood of tripping the electromechanical interface to interrupt power output to the load.

The processing unit analyzes the third data stream by accumulating the length of time during one or more measurement periods that the di/dt signal remained in a particular state, and by evaluating the accumulated time relative to the first running count of the number of times the di/dt signal level exceeded the first threshold. In the event the accumulated time that the di/dt signal remained in a particular state is high relative to the number of times the di/dt signal level exceeded the first threshold, the processing unit inhibits the tripping of the electromechanical interface since such a condition may be indicative of a nuisance load.

Other features, functions, and aspects of the invention will be evident from the Detailed Description of the Invention that follows.

BRIEF DESCRIPTION OF THE SEVERAL VIEWS OF THE DRAWINGS

The invention will be more fully understood with reference to the following Detailed Description of the Invention in conjunction with the drawings of which:

FIG. 2b is a schematic diagram illustrating a dv/dt input sense circuit that may be employed in conjunction with the di/dt input sense circuit of FIG. 2a;

DETAILED DESCRIPTION OF THE INVENTION

Low cost apparatus and methods of detecting arc faults are disclosed that can better discriminate electrical arc faults from nuisance loads. The low cost arc fault detection apparatus includes a front end that can be implemented using a reduced number of discrete electrical and electronic components. In addition, in response to the detection of a possible electrical arcing condition, the low cost arc fault detection apparatus analyzes not only changes in the power line current (di/dt), but also changes in the power line voltage (dv/dt) to discriminate electrical events with increased accuracy.

Figure 1:
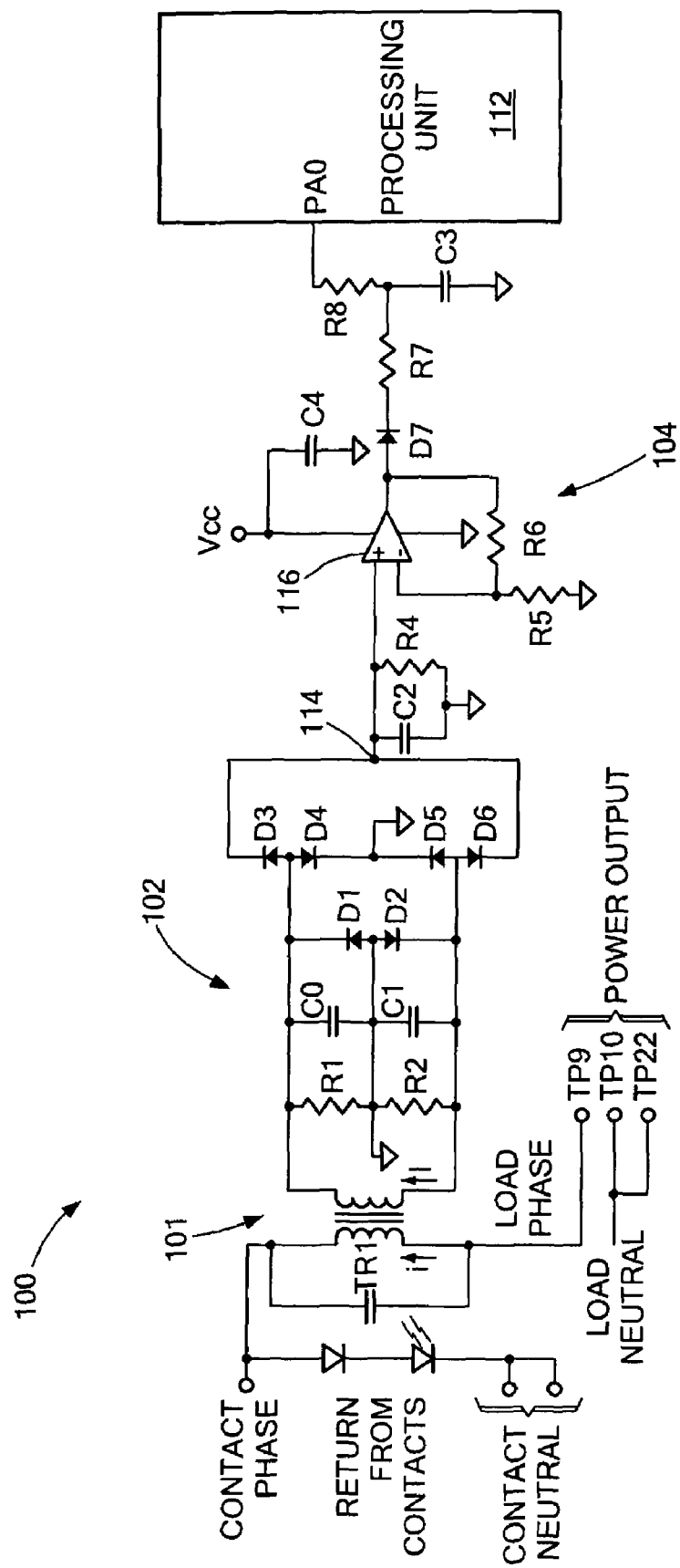
FIG. 1 is a schematic diagram illustrating conventional front end circuitry of an arc fault detection apparatus, in which the conventional front end circuitry includes a current sensor, a di/dt input sense circuit, and an arcing sense circuit.

FIG. 1 depicts an illustrative embodiment of conventional front end circuitry 100 of an arc fault detection apparatus. In the illustrated embodiment, the conventional front end circuitry 100 includes a current sensor 101, a di/dt input sense circuit 102, and an arcing sense circuit 104. The current sensor 101 includes a transformer TR1, which monitors a power input by monitoring an alternating current (AC) i flowing through a load coupleable to a power output via a load line phase terminal TP9 and load neutral terminals TP10 and TP22. The transformer TR1 is configured for magnetically coupling the high frequency components of the AC current i from its primary coil to its secondary coil, thereby providing an AC current I to the di/dt input sense circuit 102.

The di/dt input sense circuit 102 includes resistors R1-R2, capacitors C0-C1, and diodes D1-D6. The secondary coil of the transformer TR1 is connected across the resistors R1-R2, which share a common node connection to ground. The resistors R1-R2 provide a ground reference for the secondary coil of the transformer TR1. The capacitor C1 and the diode D1 are connected in parallel with the resistor R1, and the capacitor C1 and the diode D2 are connected in parallel with the resistor R2. In addition, the cathode of the diode D1 is connected to the anodes of the diodes D3-D4, and the cathode of the diode D2 is connected to the anodes of the diodes D5-D6. The cathodes of the diodes D4-D5 are connected to ground, and the cathodes of the diodes D3 and D6 are connected to a node 114 providing the output of the di/dt input sense circuit 102. The diodes D1-D2 and D4-D5 are configured to form a full wave rectified bridge, and therefore the output provided at the node 114 is a full wave rectified signal. Further, the diodes D3-D6 and a capacitor C2 included in the arcing sense circuit 104 form a logging circuit, thereby causing the level of the output provided at the node 114 to be proportional to the log of the input of the di/dt input sense circuit 102.

The arcing sense circuit 104 includes the capacitor C2, an integrating capacitor C3, a bypass capacitor C4, resistors R4-R8, an operational amplifier (op amp) 116, and a diode D7. As shown in FIG. 1, the capacitor C2 and the resistor R4 are connected between the node 114 and ground. Further, the op amp 116 and the resistors R5-R6 are configured to form a non-inverting amplifier. The capacitor C2 is connected to the non-inverting input of the op amp 116, which buffers the voltage across the capacitor C2 and provides the buffered voltage, via the diode D7 and the resistor R7, to a common node connection shared by the current limiting resistor R8 and the integrating capacitor C3. The resistor R8 and the capacitor C3 are connected between an analog input PA0 of the processing unit 112 and ground. The diode D7 is operative to prevent a reverse current flow from the integrating capacitor C3. It is noted that the combination of the resistor R7 and the capacitor C3 forms a low pass filter to filter out high frequency noise.

The arcing sense circuit 104 receives the full wave rectified signal from the di/dt input sense circuit 102, and provides voltage levels accumulated over predetermined measurement periods to the analog input PA0 of the processing unit 112, which subsequently measures the voltage levels, stores information relating to the measured voltage levels, and processes the stored information using one or more algorithms to determine whether the high frequency components of the AC current provided by the current sensor 101 resulted from an electrical arc fault or a nuisance load. In the event the high frequency AC current components resulted from an arc fault, the processing unit activates a firing circuit (not shown) to trip an electromechanical interface, thereby interrupting the power output to the load. Because the conventional front end circuitry 100 of FIG. 1 is implemented using numerous discrete electrical and electronic components, the total component and manufacturing costs of the arc fault detection apparatus is increased, while the overall reliability of the device is reduced.

Figure 2A:
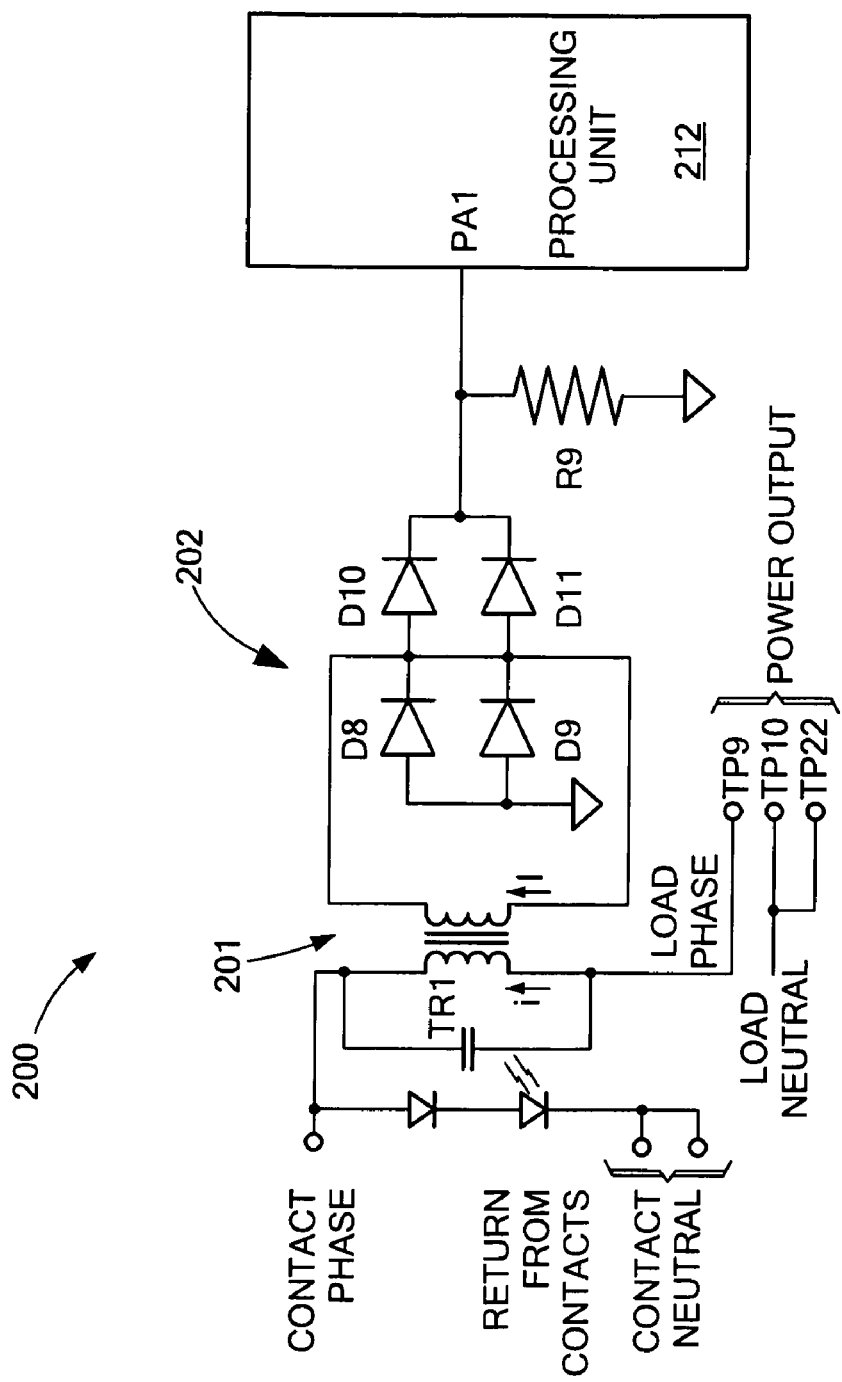
FIG. 2a is a schematic diagram illustrating the front end circuitry of an arc fault detection apparatus according to the present invention, the front end circuitry including a current sensor and a di/dt input sense circuit.

FIG. 2a depicts an illustrative embodiment of front end circuitry 200 of an arc fault detection apparatus, in accordance with the present invention. In the illustrated embodiment, the front end circuitry 200 includes a current sensor 201, a di/dt input sense circuit 202, and a processing unit 212. It is noted that the current sensor 201 and the processing unit 212 of FIG. 2a are like the current sensor 101 and the processing unit 112, respectively, of FIG. 1. Specifically, the current sensor 201 includes the transformer TR1, which monitors a power input (see FIG. 2b) by monitoring an AC current i flowing through a load coupleable to a power output (see FIG. 2a) via a load line phase terminal TP9 and load neutral terminals TP10 and TP22. The transformer TR1 magnetically couples the high frequency components of the AC current i from its primary coil to its secondary coil to provide an AC current I to the di/dt input sense circuit 202. Further, the processing unit 212 analyzes information carried by an AC signal (the "di/dt signal") generated by the di/dt input sense circuit 202 to determine whether the high frequency components of the AC current i resulted from an electrical arc fault or a nuisance load. For example, the processing unit 212 may be implemented using the MSP430F1122 micro-controller sold by Texas Instruments Inc. (TI), Dallas, Tex., USA, or any other suitable processor/controller.

As shown in FIG. 2a, the di/dt input sense circuit 202 includes diodes D8-D11, and a resistor R9. In the illustrated embodiment, the diodes D8-D11 are configured to perform full wave rectification of the AC signal provided at the secondary coil of the transformer TR1. Specifically, the cathode of the diode D8 and the anode of the diode D10 are connected to a first terminal of the secondary coil, and the cathode of the diode D9 and the anode of the diode D11 are connected to a second terminal of the secondary coil. Further, the anodes of the diodes D8-D9 are connected to ground, and the cathodes of the diodes D10-D11 are connected to a first analog input PA1 of the processing unit 212. The resistor R9 is connected between the analog input PA1 of the processing unit 212 and ground.

It should be noted that, in an alternative embodiment, the di/dt input sense circuit 202 may be configured to perform half wave rectification of the AC signal provided at the secondary coil of the transformer TR1. In addition, in further alternative embodiments, one or both of the rectifier circuit (including the diodes D8-D11) and the resistor R9 may be omitted from the front end circuitry 200, and the di/dt signal may be provided directly to the analog input PA1 of the processing unit 212.

In the presently disclosed embodiment, the transformer TR1 is configured to provide a low magnetizing inductance on its primary coil, and a high turns ratio on its secondary coil. In addition, the rectifying diodes D8-D11 are included in the front end circuitry 200 to format the information carried by the di/dt signal, and the resistor R9 is included in the circuitry 200 to limit peaking of the di/dt signal due to resonance, thereby facilitating the analysis of this information by the processing unit 212.

As a result, like the conventional front end circuitry 100 of FIG. 1, the voltage on the secondary coil is a dual function of the rate of change (di/dt) of the power line current flowing through the primary coil, and the secondary load. However, unlike the front end circuitry 100, the front end circuitry 200 of FIG. 2a does not provide a logarithmic response. Because the electrical components providing the logarithmic response of the conventional front end circuitry 100 are eliminated from the front end circuitry 200, the total cost of the front end circuitry 200 is reduced. In addition, the frequency content of the di/dt signal provided by the front end circuitry 200 can be more easily analyzed by the processing unit 212.

Figure 2B:
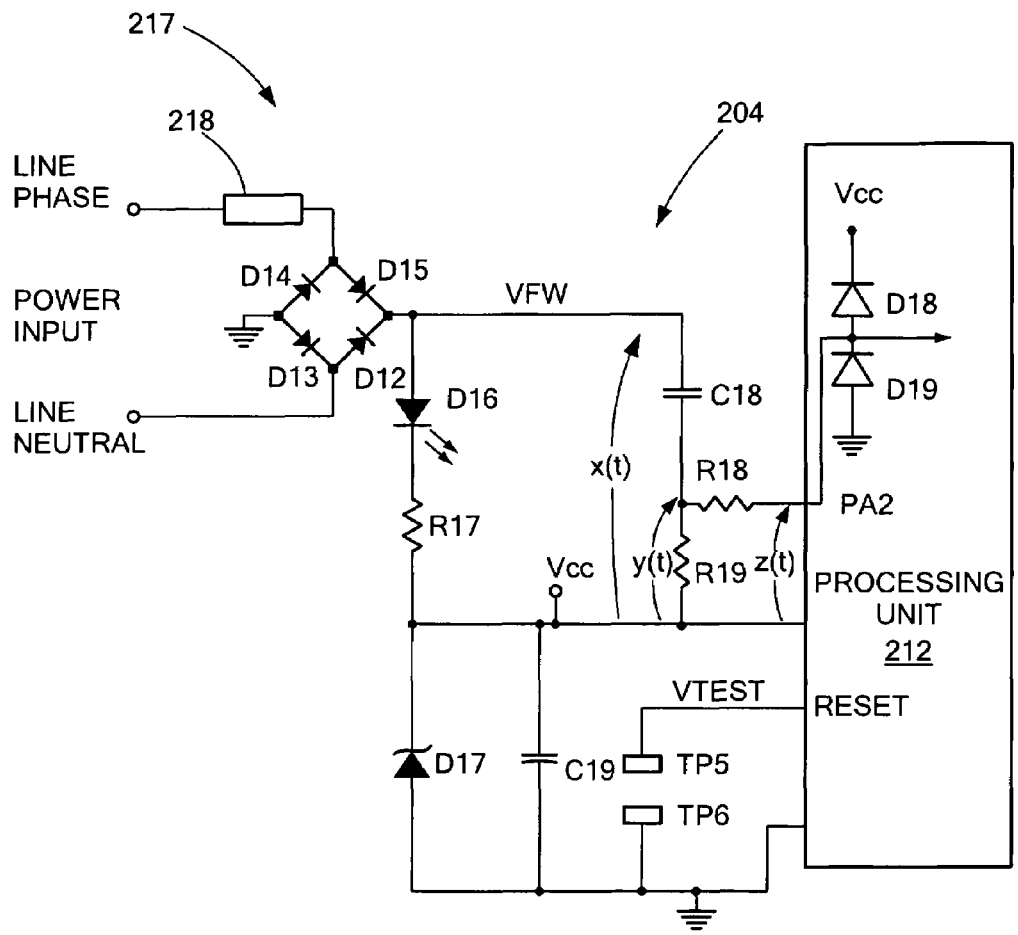

FIG. 2b depicts an illustrative embodiment of a dv/dt input sense circuit 204, which may be employed in conjunction with the di/dt input sense circuit 202 (see FIG. 2a) for better discriminating electrical arcing events from nuisance loads. In the illustrated embodiment, the dv/dt input sense circuit 204 includes resistors R18-R19 and a capacitor C18. It is noted that the capacitor C18 is a charging capacitor, and the resistor R18 is a current limiting resistor. The dv/dt input sense circuit 204 receives the full wave rectified power line voltage $V_{FW}$ from an electromechanical interface 217, which includes a diode bridge implemented by diodes D12-D15 and a solenoid 218. In the event the arc fault detection apparatus including the front end circuitry 200 detects an electrical arcing condition, the processing unit 212 controls the electromechanical interface 217 to trip the solenoid 218, thereby interrupting the power output (see FIG. 2a) to a load. Such control of an electromechanical interface by a processing unit is described in co-pending U.S. patent application Ser. No. 11/225,585 filed Sep. 13, 2005 entitled ARC FAULT DETECTION TECHNIQUE (the '585 application), the entire disclosure of which is incorporated herein by reference.

As described above, the dv/dt input sense circuit 204 receives the full wave rectified power line voltage $V_{FW}$ from the electromechanical interface 217. The charging capacitor C18 and the current limiting resistor R18 are configured to derive an AC signal z(t) (the "dv/dt signal", see FIG. 2b) from this full wave rectified voltage. The dv/dt signal carries information relating to changes in the power line voltage $V_{FW}$. Specifically, the capacitor C18 and the resistor R19 included in the dv/dt input sense circuit 204 form an R-C differentiator circuit, which provides an output y(t) that may be expressed as $$y(t) = R \cdot C \cdot \frac{dx(t)}{dt}, \quad (1)$$

in which "R" is the value of the resistor R19, "C" is the value of the capacitor C18, "x(t)" is the input of the R-C differentiator circuit, and "y(t)" is the output of the R-C differentiator circuit (see also FIG. 2b). The R-C differentiator circuit formed by the capacitor C18 and the resistor R19 therefore yields the output y(t), which is equal to the differential of the input x(t) multiplied by the constant RC. The dv/dt input sense circuit 204 provides the output y(t) to the current limiting resistor R18, which in turn provides the dv/dt signal z(t) to a second analog input PA2 of the processing unit 212 for subsequent analysis.

In one embodiment, the processing unit 212 measures the voltage of the di/dt signal provided to the analog input PA1 (see FIG. 2a) once each half cycle of the full wave rectified power line voltage $V_{FW}$ near the line voltage zero crossing. In the presently disclosed embodiment, the processing unit 212 not only employs the dv/dt signal z(t) to obtain information relating to changes in the power line voltage $V_{FW}$, but it also employs the dv/dt signal z(t) to establish the line voltage synchronization timing for measuring the voltage of the di/dt signal. Specifically, the resistor R18 and diodes D18-D19 built into the processing unit 212 form a zero-crossing detector. It is noted that the diodes D18-D19 are typically included in the processing unit 212 to protect against electrostatic discharge (ESD) over-voltage transients on the analog input PA2 for short periods of time. In the illustrated embodiment, the diodes D18-D19 are highly current limited, and may therefore also be used steady state.

Accordingly, whenever the voltage of the dv/dt signal z(t) exceeds $V_{CC}$ plus one voltage drop $V_{diode}$ of the diode D18 or D19, the diode D18 will be forward biased ("turned on"), thereby sinking current through the resistor R18 into $V_{CC}$. The processing unit 212 reads the resulting voltage of the dv/dt signal z(t) as a logical high or "1". In addition, whenever the voltage of the dv/dt signal z(t) is below $V_{CC}$ plus one diode voltage drop $V_{diode}$, the diode D18 will not be turned on. In this case, the processing unit 212 reads the resulting voltage of the dv/dt signal z(t) as a logical low or "0". It is noted that when the full wave rectified power line voltage $V_{FW}$ is provided as the input x(t) (see FIG. 2b), the case where the processing unit 212 reads a logical low, i.e., near the zero-crossing of the power line voltage, is typically limited to a relatively short period of time.

The R-C differentiator circuit formed by the capacitor C18 and the resistor R19, and the zero-crossing detector formed by the resistor R18 and the diodes D18-D19, therefore cause the dv/dt signal z(t) at the analog input PA2 to respond as follows. If $$R \cdot C \cdot \frac{d(V_{FW})}{dt} > V_{CC} + V_{diode}, \quad (2)$$

then the processing unit 212 reads the voltage of the dv/dt signal z(t) as a logical high. Alternatively, if $$R \cdot C \cdot \frac{d(V_{FW})}{dt} < V_{CC} + V_{diode}, \quad (3)$$

then the processing unit 212 reads the voltage of the dv/dt signal z(t) as a logical low.

Figure 3A:
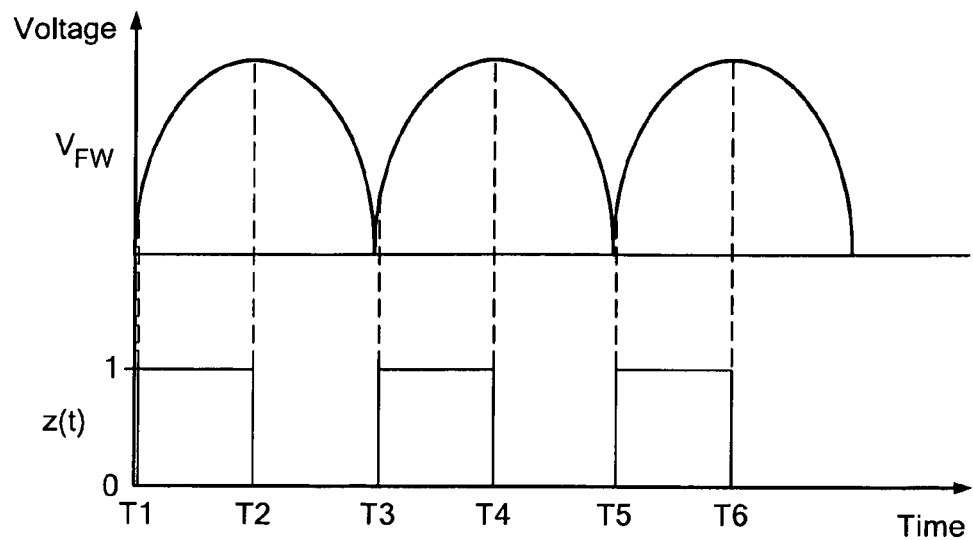
FIG. 3a is a timing diagram illustrating the operation of the dv/dt input sense circuit of FIG. 2b.
Figure 3B:
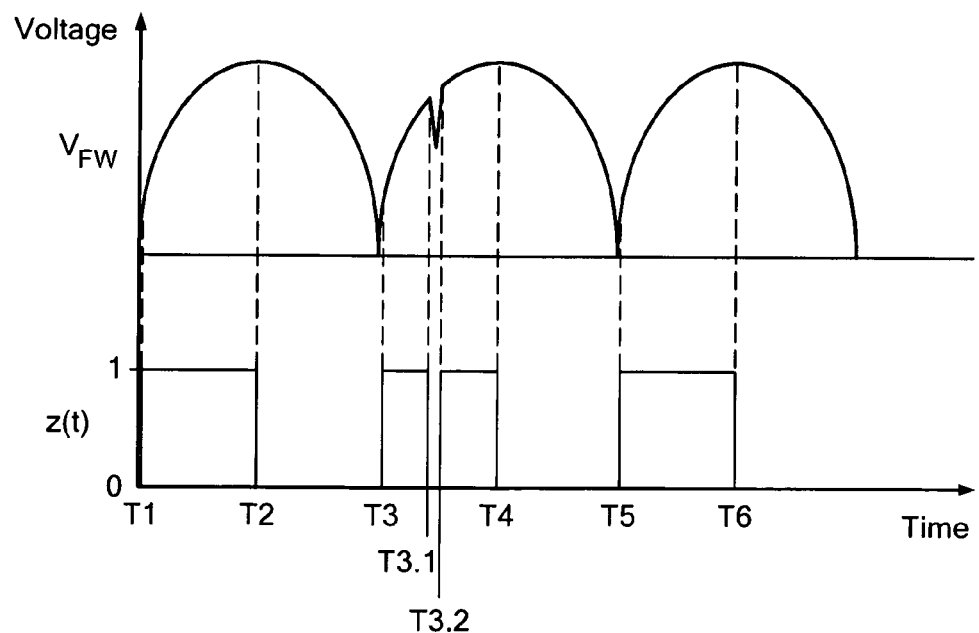
FIG. 3b is a timing diagram illustrating the operation of the dv/dt input sense circuit of FIG. 2b in the presence of a power line transient, indicating a possible electrical arcing event.

FIGS. 3a-3b are timing diagrams illustrating representations of the full wave rectified power line voltage $V_{FW}$, and the dv/dt signal z(t) (see also FIG. 2b). As shown in FIG. 3a, at times T1, T3, and T5, the condition expressed by equation (2) above is satisfied, and therefore the dv/dt signal z(t) makes a transition from a logical low voltage 0 to a logical high voltage 1. Further, at times T2, T4, and T6, the condition expressed by equation (3) above is satisfied, and therefore the dv/dt signal z(t) makes a transition from a logical high voltage 1 to a logical low voltage 0. The timing of the operation of the processing unit 212 can therefore be synchronized to the full wave power line voltage $V_{FW}$ by detecting the 0 to 1 transitions at the analog input PA2.

As shown in FIG. 3b, the dv/dt signal z(t) makes transitions from a logical low voltage 0 to a logical high voltage 1 at times T1, T3, and T5, and makes transitions from a logical high voltage 1 to a logical low voltage 0 at times T2, T4, and T6. In addition, FIG. 3b depicts a power line transient occurring between times T3.1-T3.2, which causes the dv/dt signal z(t) to make another transition from a logical high voltage 1 to a logical low voltage 0 at about time T3.1, and to make another transition from a logical low voltage 0 to a logical high voltage 1 at about time T3.2. This additional state change of the dv/dt signal is indicative of possible electrical arcing, and may be applied as an informational input to one or more suitable algorithms for determining whether the state change resulted from an electrical arc fault or a nuisance load.

It is noted that, in the presently disclosed embodiment, the dv/dt input sense circuit 204 derives the dv/dt signal from the full wave rectified power line voltage $V_{FW}$ to decrease the stress on the charging capacitor C18, thereby allowing the capacitor C18 to be implemented using a low cost electrical component. It should be understood, however, that the dv/dt signal may alternatively be derived from the half wave rectified power line voltage, or from the power line voltage directly. In addition, FIG. 2b depicts a resistor R17, a light emitting diode (LED) D16, a zener diode D17, and a capacitor C19. The resistor R17, the diodes D16-D17, and the capacitor C19 are configured to generate a local power supply $V_{CC}$, e.g., +5 $V_{DC}$, for the processing unit 212. The LED D16 provides a power-on indication. The resistor R17 and the LED D16, along with the capacitor C19, also provide an electrical path to ground to discharge the charging capacitor C18, thereby assuring that the capacitor C18 does not peak charge in response to the full wave rectified line voltage applied thereto. In alternative embodiments, the resistor R18, which provides current limiting protection to the analog input PA2 of the processing unit 212, may be omitted from the dv/dt input sense circuit 204. The zener diode D17 is connected in parallel with the capacitor C19 to provide a redundant voltage limitation.

Figure 4:
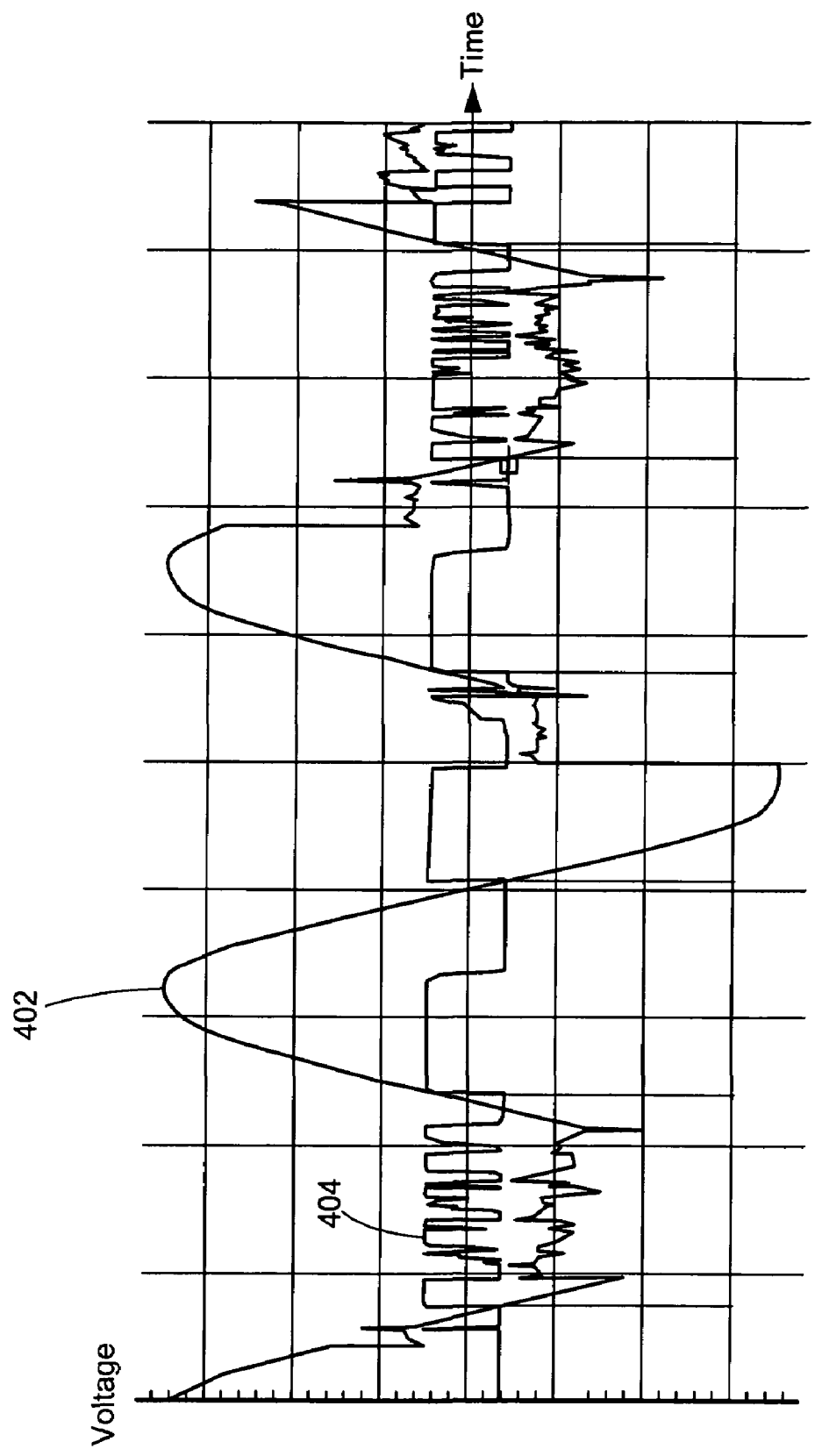
FIG. 4 is a timing diagram of a representative electrical arcing event characterized by frequent levels of high di/dt, interacting with a voltage source impedance to cause simultaneously high dv/dt conditions.

FIG. 4 illustrates how the power line voltage can be affected by an electrical arcing event known as a guillotine arc, which is typically characterized by frequent levels of high di/dt interacting with the voltage source impedance to cause simultaneously high dv/dt conditions. For example, such a guillotine arc may be produced when a thin metal blade cuts the power lines of an electrical appliance. Specifically, FIG. 4 depicts a power line voltage 402, and a dv/dt signal 404 associated with the power line voltage 402. For example, the power line voltage 402 may correspond to the power line voltage provided across the line phase and line neutral terminals of FIG. 2b. Further, the dv/dt signal 404 may correspond to the dv/dt signal generated by the dv/dt input sense circuit 204 and provided to the analog input PA2 of the processing unit 212 (see FIG. 2b). Because the presently disclosed arc fault detection apparatus can analyze changes in both the power line current (di/dt) and the power line voltage (dv/dt), electrical arcing events such as the guillotine arc can be more accurately discriminated.

In the presently disclosed embodiment, the arc fault detection apparatus analyzes changes in the power line current (di/dt) and the power line voltage (dv/dt) as follows. During a specified measurement period, the processing unit 212 polls the voltage states of the di/dt signal and the dv/dt signal at the analog inputs PA1 and PA2 (see FIGS. 2a-2b), respectively, and generates one or more data streams from the information obtained therefrom. For example, the specified measurement period may be equal to slightly less than one half of a cycle of the AC power mains, or any other suitable time period. Further, the specified measurement period may be initiated by the dv/dt signal achieving a high voltage state, or by any other suitable event or signal condition. In the one embodiment, the processing unit 212 generates three data streams, specifically, a first data stream including information relating to the number of times the di/dt signal level exceeded a first specified voltage threshold, a second data stream including information relating to the number of times the dv/dt signal level exceeded a second specified voltage threshold, and a third data stream including information relating to the length of time the di/dt signal level exceeded the first specified threshold, during the specified measurement period. For example, the first specified voltage threshold may be equal to about 100 mV or any other suitable voltage level, and the second specified voltage threshold may be equal to about $V_{CC}$ plus one diode voltage drop $V_{diode}$, i.e., about 5.7 volts, or any other suitable voltage level. The processing unit 212 can generate the first and second data streams by counting the number of state transitions occurring at the analog inputs PA1 and PA2, respectively. Further, the processing unit 212 can generate the third data stream by accumulating the length of time that the di/dt signal remains in a particular state at the analog input PA1. After the measurement period expires, the processing unit 212 stores the information relating to the first, second, and third data streams in an internal or external memory.

Next, the processing unit 212 (see FIGS. 2a-2b) analyzes the information included in the first, second, and third data streams generated during the most recent measurement period, and optionally analyzes the information included in data streams generated during one or more previous measurement periods. In the presently disclosed embodiment, the processing unit 212 analyzes the first data stream(s) by determining the number of times the di/dt signal level exceeded the first specified threshold during the respective measurement periods. Specifically, the processing unit 212 maintains a first running count of the number of times the di/dt signal level exceeded the first threshold during one or more successive measurement periods. In the event the first running count exceeds a first predetermined value (the "trip threshold"), thereby indicating an electrical arcing condition, the processing unit 212 activates a firing circuit (not shown) to trip the electromechanical interface 217 (see FIG. 2b) for interrupting the power output (see FIG. 2a) to a load. For example, the first predetermined value corresponding to the trip threshold may be equal to 100 state transitions of the di/dt signal or any other suitable number of state transitions. In one embodiment, a predetermined quantity can be subtracted from the first running count each half cycle of the AC power mains to account for the di/dt characteristics of the load, while prohibiting the first running count from falling below zero.

Similarly, the processing unit 212 analyzes the second data stream(s) by determining the number of times the dv/dt signal level exceeded the second specified threshold during the respective measurement periods. Specifically, the processing unit 212 maintains a second running count of the number of times the dv/dt signal level exceeded the second threshold during one or more successive measurement periods. In the event the second running count exceeds a second predetermined value, thereby indicating a possible electrical arcing condition, the processing unit 212 adds a specified quantity to the first running count, thereby increasing the speed and likelihood of tripping the electromechanical interface 217 to interrupt the power output to the load. For example, the second predetermined value may be equal to 4 state transitions of the dv/dt signal or any other suitable number of state transitions, and the specified quantity added to the first running count of the state transitions of the di/dt signal may be equal to 40 or any other suitable quantity. Such a specified quantity is not added to the first running count unless the second running count exceeds the second predetermined value to account for the dv/dt characteristics of the load.

In addition, the processing unit 212 analyzes the third data stream by accumulating the length of time during one or more measurement periods that the di/dt signal remained in a particular state, and by evaluating the accumulated time relative to the first running count of the number of times the di/dt signal level exceeded the first threshold. In the event the accumulated time that the di/dt signal remained in a particular state is high relative to the number of times the di/dt signal level exceeded the first threshold, the processing unit 212 inhibits the tripping of the electromechanical interface since such a condition may be indicative of a nuisance load. For example, the minimum length of the accumulated time during which the di/dt signal remained in a particular state may be equal to 2 msec or any other suitable length of time. In addition, the tripping of the electromechanical interface may be inhibited by increasing the trip threshold for activating the firing circuit or by any other suitable technique.

A method of analyzing the di/dt signal and the dv/dt signal generated by the di/dt input sense circuit 202 and the dv/dt input sense circuit 204 (see FIGS. 2a-2b), respectively, for better discriminating electrical arcing events, is described below with reference to FIGS. 5a-5d. It is understood that such analysis of the di/dt and dv/dt signals can be performed by the processing unit 212 of FIGS. 2a-2b. As depicted in step 502 (see FIG. 5a), if the processing unit detects the voltage state of the dv/dt signal transitioning from a low voltage state to a high voltage state, then the processing unit starts a timer for tracking the measurement period. For example, the timer may be implemented as an 8-bit timer having an initial count value of zero. Further, the timer may be implemented internally within the processing unit, or may be implemented as an external timer. As described above, the di/dt signal is provided to the analog input PA1 of the processing unit 212 by the di/dt input sense circuit 202 (see FIG. 2a). Next, the processing unit counts the state transitions of the dv/dt signal, as depicted in step 504. As described above, the dv/dt signal is provided to the analog input PA2 of the processing unit 212 by the dv/dt input sense circuit 204 (see FIG. 2b). Specifically, a determination is made, as depicted in step 504.1 (see FIG. 5c), as to whether the voltage state of the dv/dt signal is detected transitioning from low to high. Such a determination may be made using a first comparator that compares the level of the dv/dt signal with a specified voltage threshold. For example, the first comparator may be implemented internally within the processing unit or as an external comparator. In the event the state of the dv/dt signal is detected transitioning from low to high, a first counter is incremented for counting the state transitions of the dv/dt signal that occur during the measurement period, as depicted in step 504.2. Like the timer and the first comparator described above, the first counter may be implemented internally within the processing unit or as an external counter.

Figure 5A:
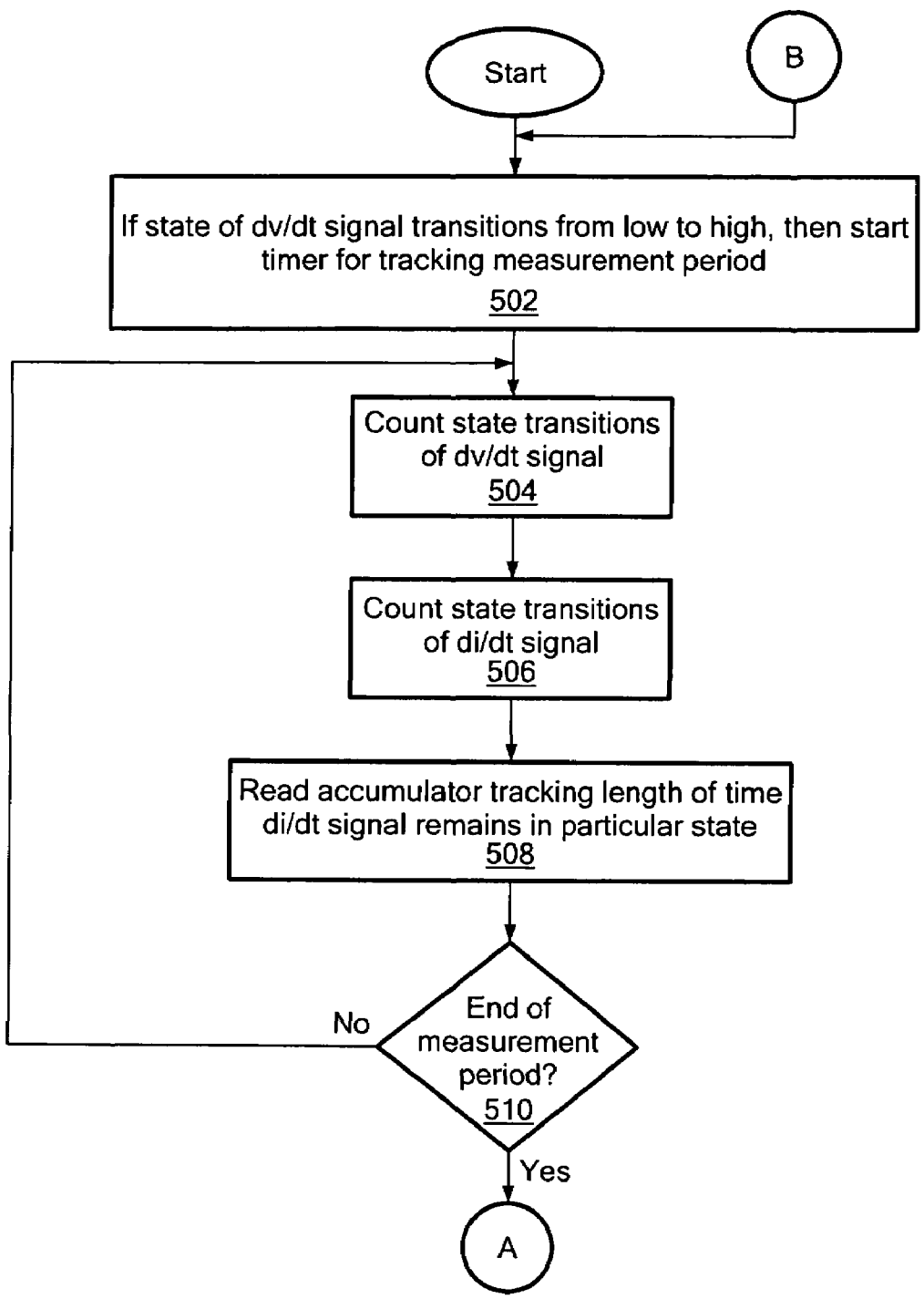
FIGS. 5a-5d are flow diagrams illustrating a method of analyzing information obtained via the di/dt input sense circuit of FIG. 2a and the dv/dt input sense circuit of FIG. 2b for better discriminating electrical arc faults from nuisance loads.

Next, the processing unit counts the state transitions of the di/dt signal, as depicted in step 506 (see FIG. 5*a*). Specifically, a determination is made, as depicted in step 506.1 (see FIG. 5*d*), as to whether the voltage state of the di/dt signal is detected transitioning from low to high. Such a determination may be made using a second comparator that compares the level of the di/dt signal with a specified voltage threshold. For example, the second comparator may be implemented internally within the processing unit or as an external comparator. In the event the state of the di/dt signal is detected transitioning from low to high, a second counter is incremented for counting the state transitions of the di/dt signal that occur during the measurement period, as depicted in step 506.2. Like the timer, the first and second comparators, and the first counter described above, the second counter may be implemented internally within the processing unit or as an external counter.

Next, as depicted in step 508 (see FIG. 5*a*), the processing unit reads an internal or external accumulator tracking the length of time that the di/dt signal remains in a particular state, e.g., a high voltage state. Specifically, the processing unit reads the value of the timer at the time the state of the di/dt signal is detected transitioning from low to high, and stores the timer value in memory in association with a variable "$T_{beg}$", as depicted in step 508.1 (see FIG. 5*d*). In the event a subsequent determination is made as to whether the state of the di/dt signal is detected transitioning from low to high, as depicted in step 506.1, and no such state transition of the di/dt signal is detected, still another determination is made as to whether the state of the di/dt signal is currently high, as depicted in step 508.2. In the event the state of the di/dt signal is currently high, the value of the timer is read and stored in memory in association with a variable "$T_{end}$", as depicted in step 508.3. Next, the length of time "$T_{acc}$" the di/dt signal remains in the high voltage state is accumulated according to the following expressions:

$$T = T_{end} - T_{beg},$$

$$T_{acc} = T_{acc} + T. \quad (4)$$

Figure 5B:
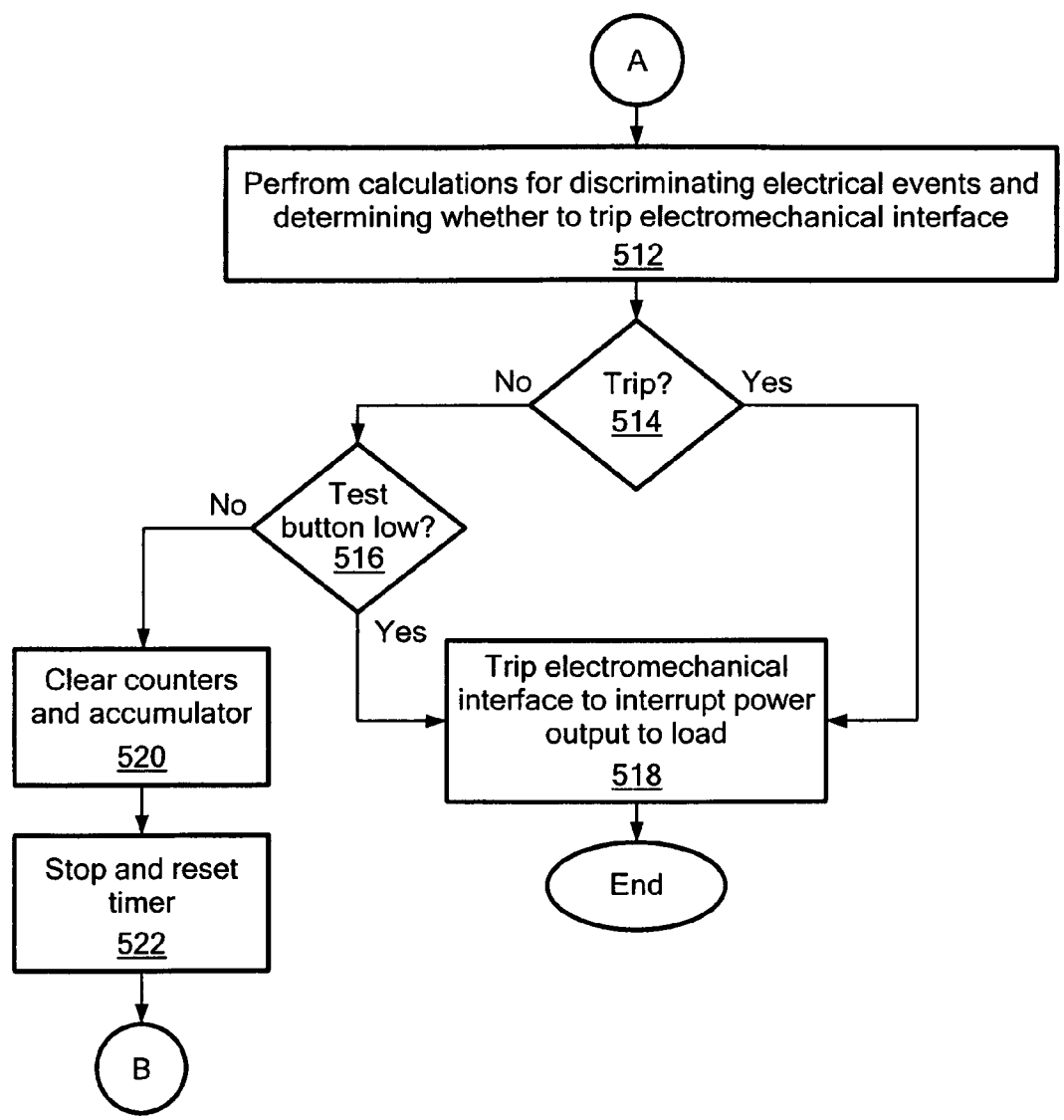
Figure 5C:
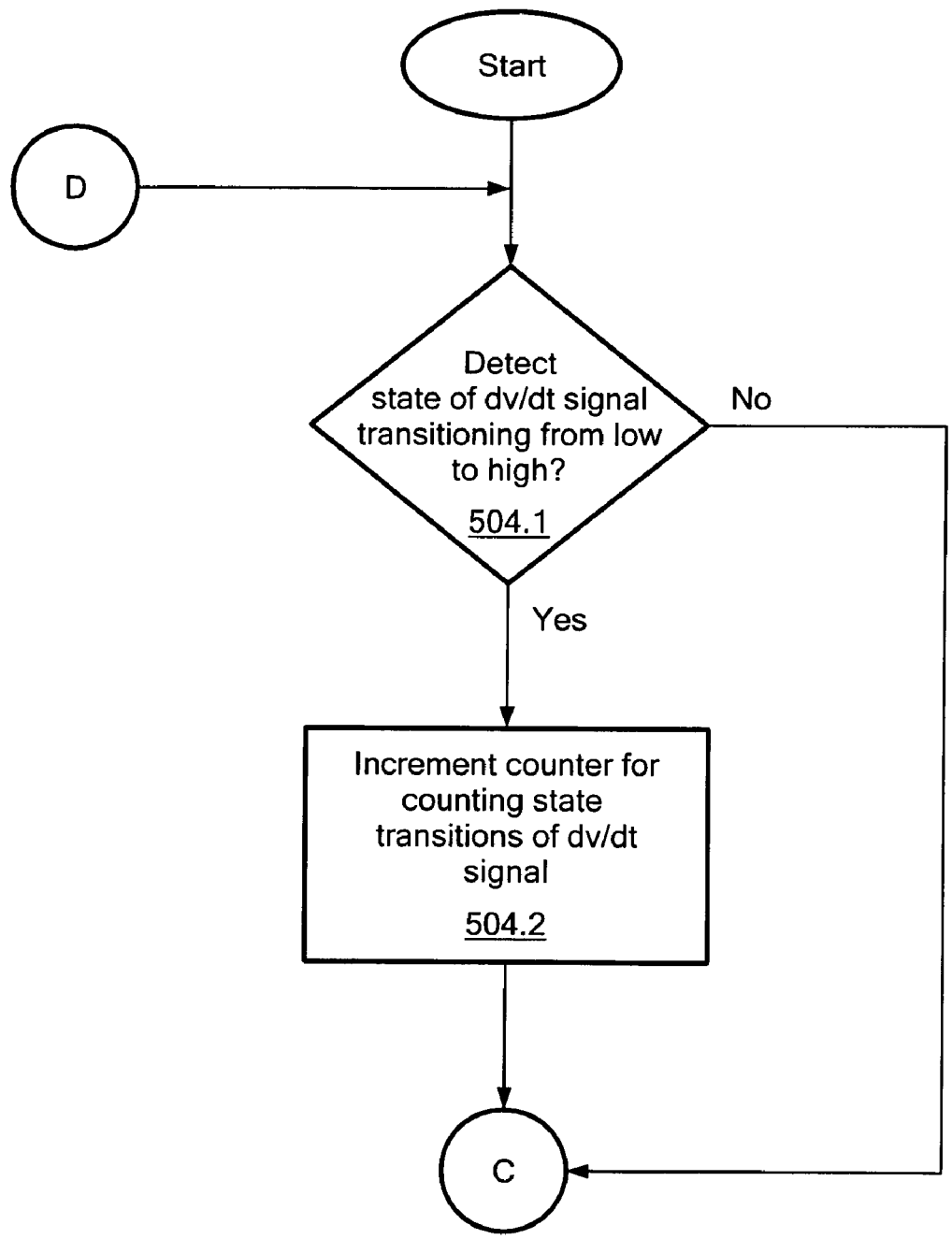
Figure 5D:
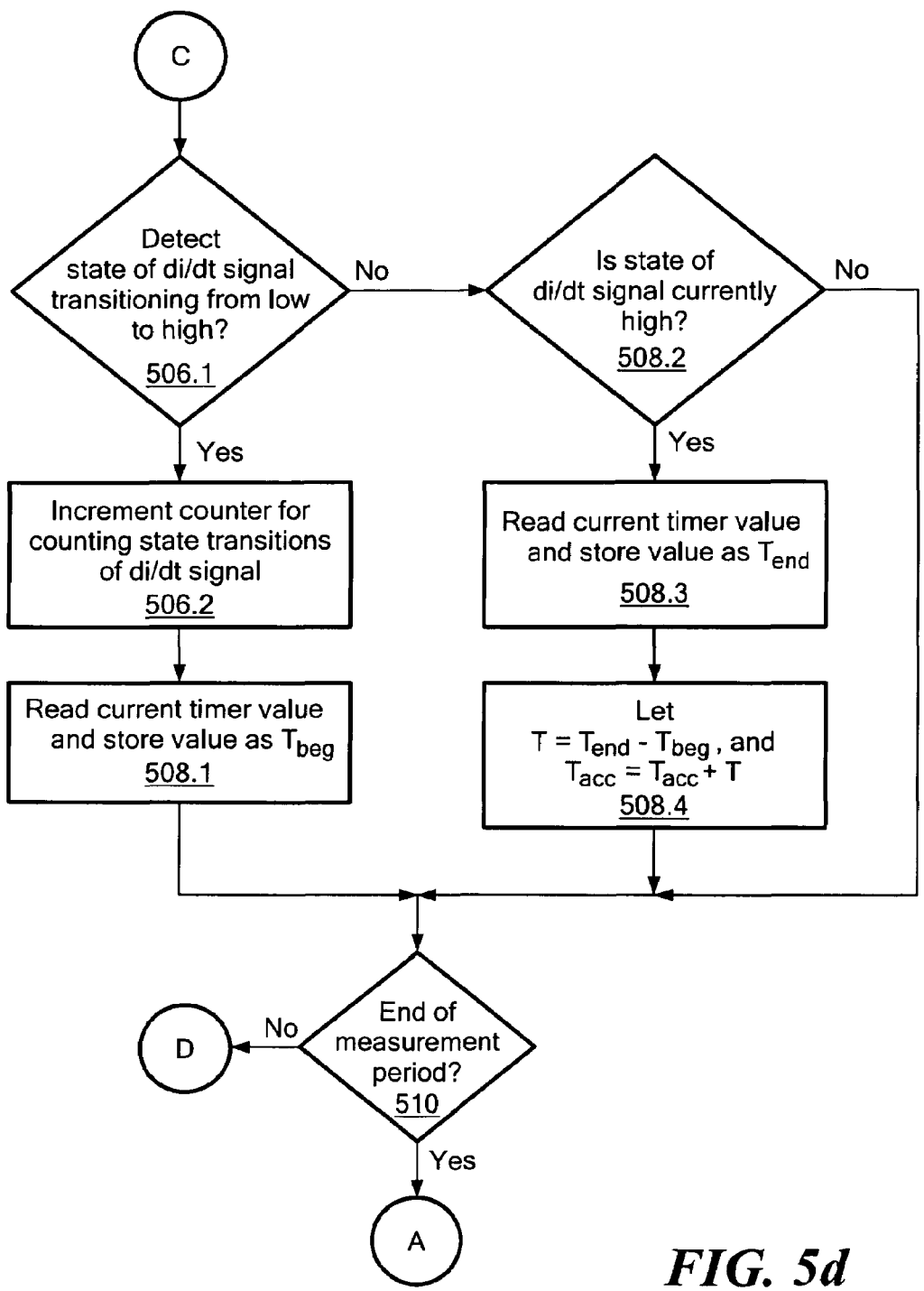

A determination is then made as to whether the measurement period has expired, as depicted in step 510 (see FIGS. 5*a* and 5*d*). In the event the measurement period has not expired, the method loops back to step 504.1 (see FIG. 5*c*).

In the event the measurement period has expired, calculations are performed to discriminate electrical events and to determine whether to trip the electromechanical interface of the arc fault detection apparatus, as depicted in step 512 (see FIG. 5*b*). As described above, in one embodiment, the processing unit generates first and second data streams including information relating to the number of times the dv/dt signal and the di/dt signal levels exceeded the respective voltage thresholds, and a third data stream including information relating to the length of time the di/dt signal level exceeded its respective voltage threshold, during the measurement period.

Next, the processing unit maintains running counts of the number of times the dv/dt and di/dt signal levels exceeded the respective voltage thresholds during the measurement period. In addition, the processing unit evaluates the accumulated time that the di/dt signal remained in the high voltage state relative to the running count of the number of times the di/dt signal level exceeded its respective voltage threshold during the measurement period. Next, a determination is made as to whether the electromechanical interface is to be tripped, as depicted in step 514, based on the running counts and accumulated times maintained and evaluated by the processing unit. In the event it is determined that the electromechanical interface should be tripped, the processing unit 212 trips the electromechanical interface 217 (see FIG. 2*b*) to interrupt the power output to the load, as depicted in step 518. Otherwise, a determination is made as to whether a test button associated with the arc fault detection apparatus has been actuated, as depicted in step 516. In the event the test button has been actuated, the electromechanical interface is tripped to interrupt the power output to the load, as depicted in step 518, thereby allowing a user of the arc fault detection apparatus to perform a functional test of the device. If the test button has not been actuated, then the first and second counters and the accumulator are all cleared, as depicted in step 520, the timer is stopped and reset, as depicted in step 522, and the method loops back to step 502 (see FIG. 5*a*).

It is appreciated that the functions necessary to implement the presently disclosed arc fault detection apparatus, including the di/dt input sense circuit 202 (see FIG. 2*a*) and the dv/dt input sense circuit 204 (see FIG. 2*b*), may be embodied in whole or in part using hardware or software or some combination thereof using digital signal processors, micro-controllers, microprocessors, programmable logic arrays, or any other suitable hardware and/or software.

It will further be appreciated by those of ordinary skill in the art that further modifications to and variations of the above-described low cost arc fault detection technique may be made without departing from the inventive concepts disclosed herein. Accordingly, the invention should not be viewed as limited except as by the scope and spirit of the appended claims.

What is claimed is:

1. Arc fault detection apparatus, comprising:
   a power input;
   a processor integrated circuit (IC) including a first input, a second input, and at least two input protection diodes, the two input protection diodes being coupled to one another at a common node and connected in series between a supply voltage and ground, the first input being connected to the common node of the two input protection diodes;
   a differential voltage input sense circuit operative to sense at least one differential voltage (dv/dt) signal associated with the power input, and to provide the dv/dt signal to the first input of the processor IC; and
   a differential current input sense circuit operative to sense at least one differential current (di/dt) signal associated with the power input, and to provide the di/dt signal to the second input of the processor IC;
   wherein the two input protection diodes of the processor IC form a zero-crossing detector operative to detect zero crossings of the dv/dt signal, and
   wherein the processor IC is operative to measure the di/dt signal at times based on the detected zero crossings of the dv/dt signal, and to analyze the dv/dt signal and the di/dt signal based on at least one characteristic of the respective dv/dt and di/dt signals for determining whether the dv/dt and di/dt signal characteristics are indicative of an arc fault.

2. The arc fault detection apparatus of claim 1 wherein the differential current input sense circuit includes a rectifier circuit configured to receive AC current components of the power input, to perform rectification of the AC current components for generating the di/dt signal, and to provide the di/dt signal directly to the second input of the processor IC, and wherein the rectifier circuit is selected from the group consisting of a full wave rectifier circuit and a half wave rectifier circuit.

3. The arc fault detection apparatus of claim 1 wherein the differential voltage input sense circuit includes a charging capacitor and a resistor, the charging capacitor and the resistor being coupled to one another at a common node and connected in series between the power input and the supply voltage, the common node of the charging capacitor and the resistor being connected to the first input of processor IC.

4. The arc fault detection apparatus of claim 1 wherein the processor IC is operative to analyze the di/dt and dv/dt signals during at least one specified measurement period.

5. The arc fault detection apparatus of claim 4 wherein the specified measurement period is slightly less than one half of a cycle of an AC power mains.

6. The arc fault detection apparatus of claim 4 wherein a first characteristic of the dv/dt signal corresponds to the number of voltage state transitions of the dv/dt signal occurring during the specified measurement period.

7. The arc fault detection apparatus of claim 4 wherein a first characteristic of the di/dt signal corresponds to the number of voltage state transitions of the di/dt signal occurring during the specified measurement period.

8. The arc fault detection apparatus of claim 7 wherein a second characteristic of the di/dt signal corresponds to a length of time that the di/dt signal remains in a particular voltage state.

9. The arc fault detection apparatus of claim 8 wherein the processor IC is further operative to evaluate the length of time that the di/dt signal remains in a particular voltage state relative to the number of voltage state transitions of the di/dt signal occurring during a specified measurement period for determining whether the first and second characteristics of the di/dt signal are indicative of an arc fault.

10. The arc fault detection apparatus of claim 7 wherein a second characteristic of the dv/dt signal corresponds to the number of voltage state transitions of the dv/dt signal occurring during the specified measurement period, and wherein the processor IC is further operative to maintain a first running count of the number of voltage state transitions of the di/dt signal occurring during the specified measurement period, and to maintain a second running count of the number of voltage state transitions of the dv/dt signal occurring during the specified measurement period.

11. The arc fault detection apparatus of claim 10 wherein the processor IC is further operative, in the event the first running count exceeds a first predetermined value, to generate a processor output for use in interrupting a power output to a load.

12. The arc fault detection apparatus of claim 10 wherein the processor IC is further operative, in the event the second running count exceeds a second predetermined value, to add a specified quantity to the first running count.

13. The arc fault detection apparatus of claim 12 wherein the processor IC is further operative, in the event the first running count exceeds a first predetermined value, to generate a processor output for use in interrupting a power output to a load.

14. A method of detecting an arc fault, comprising the steps of:

sensing, by a differential voltage input sense circuit, at least one differential voltage (dv/dt) signal associated with a power input;

providing, by the differential voltage input sense circuit, the dv/dt signal to a first input of a processor integrated circuit (IC), the processor IC including the first input, a second input, and at least two input protection diodes, the two input protection diodes being coupled to one another at a common node and connected in series between a supply voltage and ground, the first input being connected to the common node of the two input protection diodes;

detecting, by a zero-crossing detector formed by the two input protection diodes of the processor IC, zero crossings of the dv/dt signal;

sensing, by a differential current input sense circuit, at least one differential current (di/dt) signal associated with the power input;

providing, by the differential current input sense circuit, the di/dt signal directly to the second input of the processor IC;

measuring, by the processor IC, the di/dt signal at times based on the detected zero crossings of the dv/dt signal; and analyzing, by the processor IC, the dv/dt signal and the di/dt signal based on at least one characteristic of the respective dv/dt and di/dt signals for determining whether the dv/dt and di/dt signal characteristics are indicative of an arc fault.

15. The method of claim 14 further including the step of sensing changes in voltage across a charging capacitor caused by AC voltage components of the power input, wherein the dv/dt signal corresponds to the changing voltage across the charging capacitor.

16. The method of claim 14 wherein the analyzing step includes analyzing the di/dt and dv/dt signals during at least one specified measurement period.

17. The method of claim 16 wherein the analyzing step includes analyzing the di/dt and dv/dt signals during the at least one specified measurement period, and wherein a first characteristic of the dv/dt signal corresponds to the number of voltage state transitions of the dv/dt signal occurring during the specified measurement period.

18. The method of claim 16 wherein the analyzing step includes analyzing the di/dt and dv/dt signals during the at least one specified measurement period, and wherein a first characteristic of the di/dt signal corresponds to the number of voltage state transitions of the di/dt signal occurring during the specified measurement period.

19. The method of claim 18 wherein the analyzing step includes analyzing the di/dt and dv/dt signals during the at least one specified measurement period, and wherein a second characteristic of the di/dt signal corresponds to a length of time that the di/dt signal remains in a particular voltage state.

20. The method of claim 19 wherein the analyzing step includes evaluating the length of time that the di/dt signal remains in a particular voltage state relative to the number of voltage state transitions of the di/dt signal occurring during a specified measurement period for determining whether the first and second characteristics of the di/dt signal are indicative of an arc fault.

21. The method of claim 18 wherein the analyzing step includes analyzing the di/dt and dv/dt signals during the at least one specified measurement period, wherein a second characteristic of the dv/dt signal corresponds to the number of voltage state transitions of the dv/dt signal occurring during the specified measurement period, and wherein the analyzing step further includes maintaining a first running count of the number of voltage state transitions of the di/dt signal occurring during the specified measurement period, and maintaining a second running count of the number of voltage state transitions of the dv/dt signal occurring during the specified measurement period.

22. The method of claim 21 further including the step of, in the event the first running count exceeds a first predetermined value, generating a processor output by the processor IC for use in interrupting a power output to a load.

23. The method of claim 21 further including the step of, in the event the second running count exceeds a second predetermined value, adding a specified quantity to the first running count by the processor IC.

24. The method of claim 23 further including the step of, in the event the first running count exceeds a first predetermined value, generating a processor output by the processor IC for use in interrupting a power output to a load.

* * * * *